(12) United States Patent
Yudovsky et al.

(10) Patent No.: US 6,589,352 B1
(45) Date of Patent: *Jul. 8, 2003

(54) SELF ALIGNING NON CONTACT SHADOW RING PROCESS KIT

(75) Inventors: Joseph Yudovsky, Campbell, CA (US); Lawrence C. Lei, Milpitas, CA (US); Salvador Umotoy, Antioch, CA (US); Tom Madar, Sunnyvale, CA (US); Girish Dixit, San Jose, CA (US); Gwo-Chuan Tzu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/459,313

(22) Filed: Dec. 10, 1999

(51) Int. Cl.$^7$ ............................................... C23C 16/00
(52) U.S. Cl. ..................... 118/729; 118/720; 118/728; 118/500; 156/345.3; 156/345.51; 156/345.54; 204/298.11; 204/298.15
(58) Field of Search ................................. 118/728, 729, 118/500, 720; 156/345.3, 345.51, 345.54; 204/298.11, 298.15

(56) References Cited

U.S. PATENT DOCUMENTS

| | | | |
|---|---|---|---|
| 5,304,248 A | * 4/1994 | Cheng et al. ................ 118/728 |
| 5,326,725 A | 7/1994 | Sherstinsky et al. ......... 437/225 |
| 5,328,722 A | 7/1994 | Ghanayem et al. .......... 427/250 |
| 5,352,294 A | 10/1994 | White et al. ................. 118/725 |
| 5,476,548 A | * 12/1995 | Lei et al. ..................... 118/729 |
| 5,516,367 A | 5/1996 | Lei et al. ..................... 118/725 |
| 5,584,936 A | 12/1996 | Pickering et al. ............ 118/728 |
| 5,632,873 A | 5/1997 | Stevens et al. ......... 204/298.15 |
| 5,769,951 A | 6/1998 | van de Ven et al. ........ 118/725 |
| 5,846,332 A | * 12/1998 | Zhao et al. .................. 118/728 |
| 5,860,640 A | 1/1999 | Marohl et al. ........... 269/289 R |
| 5,882,419 A | 3/1999 | Sinha et al. ................. 118/729 |
| 5,888,304 A | 3/1999 | Umotoy et al. .............. 118/720 |
| 6,040,011 A | * 3/2000 | Yudovsky et al. ...... 427/255.28 |
| 6,186,092 B1 | * 2/2001 | Tsai et al. .................... 118/728 |
| 6,231,674 B1 | * 5/2001 | Chen et al. .................. 118/720 |
| 6,328,808 B1 | * 12/2001 | Tsai et al. .................... 118/729 |
| 6,355,108 B1 | * 3/2002 | Won et al. ................... 118/728 |
| 6,364,954 B2 | * 4/2002 | Umotoy et al. .............. 118/715 |
| 6,368,450 B2 | * 4/2002 | Hayashi ....................... 156/345 |
| 6,375,748 B1 | * 4/2002 | Yudovsky et al. ........... 118/728 |
| 6,511,543 B1 | * 1/2003 | Stauss et al. ................. 118/503 |

FOREIGN PATENT DOCUMENTS

| | | | | |
|---|---|---|---|---|
| EP | 0553691 A1 | 8/1993 | ........... C23C/16/44 |
| EP | 0688888 A2 | 12/1995 | ........... C23C/16/44 |
| EP | 0698674 A2 | 2/1996 | ........... C23C/16/44 |
| EP | 0 747 934 A1 | 12/1996 | ........... H01L/21/00 |
| EP | 0 807 960 A1 | 11/1997 | ........... H01L/21/00 |
| EP | 0 776 990 B1 | 2/2002 | ........... C23C/16/44 |
| JP | 2001-274104 | * 10/2001 | |

OTHER PUBLICATIONS

Foreign search report dated Jul. 10, 2002.
EP search report dated Apr. 2, 2001.

* cited by examiner

Primary Examiner—Jeffrie R. Lund
(74) Attorney, Agent, or Firm—Moser Patterson Sheridan LLP

(57) ABSTRACT

The invention provides a removable first edge ring configured for pin and recess/slot coupling with a second edge ring disposed on the substrate support. In one embodiment, a first edge ring includes a plurality of pins, and a second edge ring includes one or more alignment recesses and one or more alignment slots for mating engagement with the pins. Each of the alignment recesses and alignment slots are at least as wide as the corresponding pins, and each of the alignment slots extends in the radial direction a length that is sufficient to compensate for the difference in thermal expansion between the first edge ring and the second edge ring.

26 Claims, 12 Drawing Sheets

SELF ALIGNING NON CONTACT SHADOW RING PROCESS KIT

BACKGROUND OF THE INVENTION

1. Field the Invention

The present invention relates to an improved susceptor which inhibits the deposition of process gasses on the edge and backside of a substrate, and which may be easily removed and cleaned.

2. Background of the Related Art

Chemical vapor deposition (CVD) is one of a number of processes used to deposit thin films of material on semiconductor substrates. To process substrates using CVD, a vacuum chamber is provided with a susceptor configured to receive a substrate. In a typical CVD chamber, the substrate is placed into and removed from the chamber by a robot blade and is supported by a substrate support during processing. A precursor gas is charged into the vacuum chamber through a gas manifold plate situated above the substrate, where the substrate is heated to process temperatures, generally in the range of about 250° to 650° C. The precursor gas reacts on the heated substrate surface to deposit a thin layer thereon and to form volatile byproduct gases, which are pumped away through the chamber exhaust system.

A primary goal of substrate processing is to obtain the largest useful surface area, and as a result the greatest number of chips, possible from each substrate. This is highlighted by the recent demands from semiconductor chip manufacturers to minimize edge exclusion on the substrates processed, so that as little of the substrate surface as possible, including the edge of the wafer, is wasted. Some important factors to consider include processing variables that affect the uniformity and thickness of the layer deposited on the substrate, and contaminants that may attach to the substrate and render all or a portion of the substrate defective or useless. Both of these factors should be controlled to maximize the useful surface area for each substrate processed.

One source of particle contamination in the chamber is material deposited at the edge or on the backside of the substrate that flakes off or peels off during a subsequent process. Substrate edges are typically beveled, making deposition difficult to control over these surfaces. Thus, deposition at substrate edges is typically nonuniform and, where metal is deposited, tends to adhere differently to a dielectric than to silicon. If a wafer's dielectric layer does not extend to the bevel, metal may be deposited on a silicon bevel and eventually chip or flake, generating unwanted particles in the chamber. Additionally, chemical mechanical polishing is often used to smooth the surface of a substrate coated with tungsten or other metals. The act of polishing may cause any deposits on the edge and backside surfaces to flake and generate unwanted particles.

A number of approaches have been employed to control the deposition on the edge of the substrate during processing. One approach employs a shadow ring which essentially masks a portion of the perimeter of the substrate from the process gasses. One disadvantage with the shadow ring approach is that, by masking a portion of the substrate's perimeter, the shadow ring reduces the overall useful surface area of the substrate. This problem is made worse if the shadow ring is not accurately aligned with the substrate, and alignment can be difficult to achieve.

Another approach employs a purge ring near the edge of the substrate for delivering a purge gas along the substrate's edge to prevent edge deposition. The purge gas limits or prevents the deposition gas from reaching the substrate and thus limits or prevents deposition on the wafer's beveled edge. A third approach uses a shutter ring and a purge ring in combination to form a purge gas chamber having a purge gas inlet and outlet adjacent the substrate's edge so as to guide the purge gas across the wafer's edge.

A wafer typically sits inside (radially) the purge ring, with a gap therebetween. Conventionally, purge rings are made of aluminum and are welded to the substrate support in an effort to prevent the ring from deforming during processing. However, during the thermal cycling which occurs within a CVD processing chamber, the aluminum rings nonetheless deform, losing the integrity of their shape and therefore compromise their ability to keep particles from depositing on the substrate's edge. This can change the size of the gap, leading to non-uniformity of deposition across the wafer's edge. As the aluminum rings expand and contract, material thereon can flake, and create particles which can contaminate the wafer.

Further, in order for the rings to work effectively for shadowing and/or for purging, they must be frequently cleaned to remove deposition material which can alter the gap or flake off and contaminate the wafer. Such cleaning increases chamber downtime, reduces throughput and results in higher operating costs.

Accordingly a need exists for an improved susceptor which can reliably prevent edge deposition, and which can be easily cleaned.

SUMMARY OF THE INVENTION

In one aspect, the present invention overcomes the problems of the prior art by providing a substrate support having a removable edge ring, which may be made of a material having a lower coefficient of thermal expansion (CTE) than that of the substrate support. The edge ring may be a shadow ring, a purge ring, or function as both edge ring and shadow ring. The edge ring and the substrate support are configured for pin and slot coupling. In one aspect, either the edge ring or the substrate support includes a plurality of pins, and the other of the edge ring or the substrate support includes a plurality of alignment slots in which the pins may be inserted. Each of the slots is at least as wide as a corresponding one of the plurality of pins and extends in the radial direction to a length, which is sufficient to compensate for the difference in thermal expansion between the substrate support and the edge ring.

In another aspect, the invention provides a removable first edge ring positioned above the substrate support and configured for pin and slot coupling with a second edge ring attached to the substrate support. Preferably, either the first edge ring or the second edge ring includes a plurality of pins, and the other of the first edge ring or second edge ring includes one or more alignment recesses and one or more alignment slots. The pins are inserted into the alignment recesses and alignment slots to couple the two edge rings in alignment. Each of the alignment recesses and alignment slots are at least as wide as the corresponding one of the plurality of pins, and each of the alignment slots extends in the radial direction to a length that is sufficient to compensate for the difference in thermal expansion between the first edge ring and the second edge ring.

Other objects, features and advantages of the present invention will become more fully apparent from the following detailed description of the preferred embodiments, the appended claims and the accompanying drawings.

DETAILED DESCRIPTION THE PREFERRED EMBODIMENT

Figure 1:
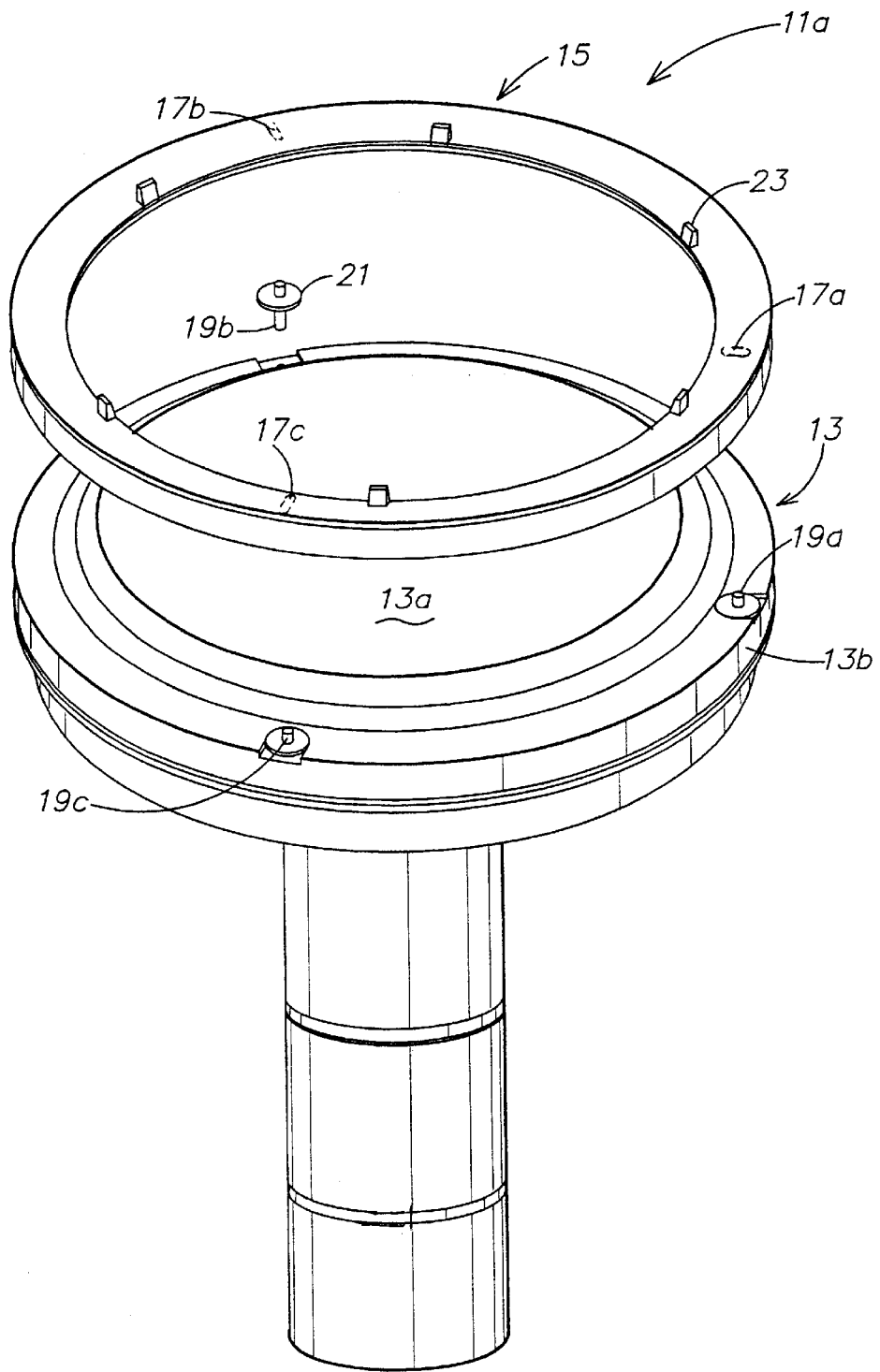
FIG. 1 is an exploded perspective view of a susceptor of the invention.

FIG. 1 is an exploded perspective view of a susceptor 11a. The susceptor 11a comprises a substrate support 13, adapted for pin and slot coupling with an edge ring, such as purge ring 15. Specifically, the substrate support 13 comprises three pins 19a–c which extend upwardly from the top surface of substrate support 13. The bottom surface of the purge ring 15 comprises three alignment slots 17a–c positioned to interface with the three pins 19a–c. The substrate support 13 comprises a central wafer supporting surface 13a, and the three pins 19a–c are disposed substantially equally spaced around the substrate supporting surface 13a. Each of the slots 17a–c is at least as wide as the corresponding pin 19a–c, and extends radially outward from the center of the substrate supporting surface 13a, in the direction in which the substrate support 13 expands and contracts during thermal cycling.

The substrate support 13 is preferably made of a metal such as aluminum, as is conventional. The purge ring 15 is generally made of a material having a lower coefficient of thermal expansion (CTE) than the CTE of the substrate support 13 material. Preferably the purge ring 15 is made of a ceramic material. The slots 17a–c extend a length which is sufficient to compensate for the difference in thermal expansion between the substrate support 13 and the purge ring 15, over the range of process temperatures to which the susceptor 11a is exposed. This difference in thermal expansion may be due to the different CTE of the purge ring 15 material and the substrate support 13 material. Preferably each pin 19a–c is surrounded by a pad 21 made of a thermally insulating material, so as to achieve thermal insulation between the substrate support 13 and the purge ring 15, as further described below with reference to FIG. 2. The pads 21 are preferably made of a highly polished ceramic and therefore allow the purge ring 15 to slide easily therealong while minimizing particle generation. The purge ring 15 may further include a plurality of wafer guide pins 23 to facilitate accurate wafer placement, as is disclosed in U.S. patent application Ser. No. 09/103,462 filed Jun. 24, 1998 (incorporated herein in its entirety).

Figure 2:
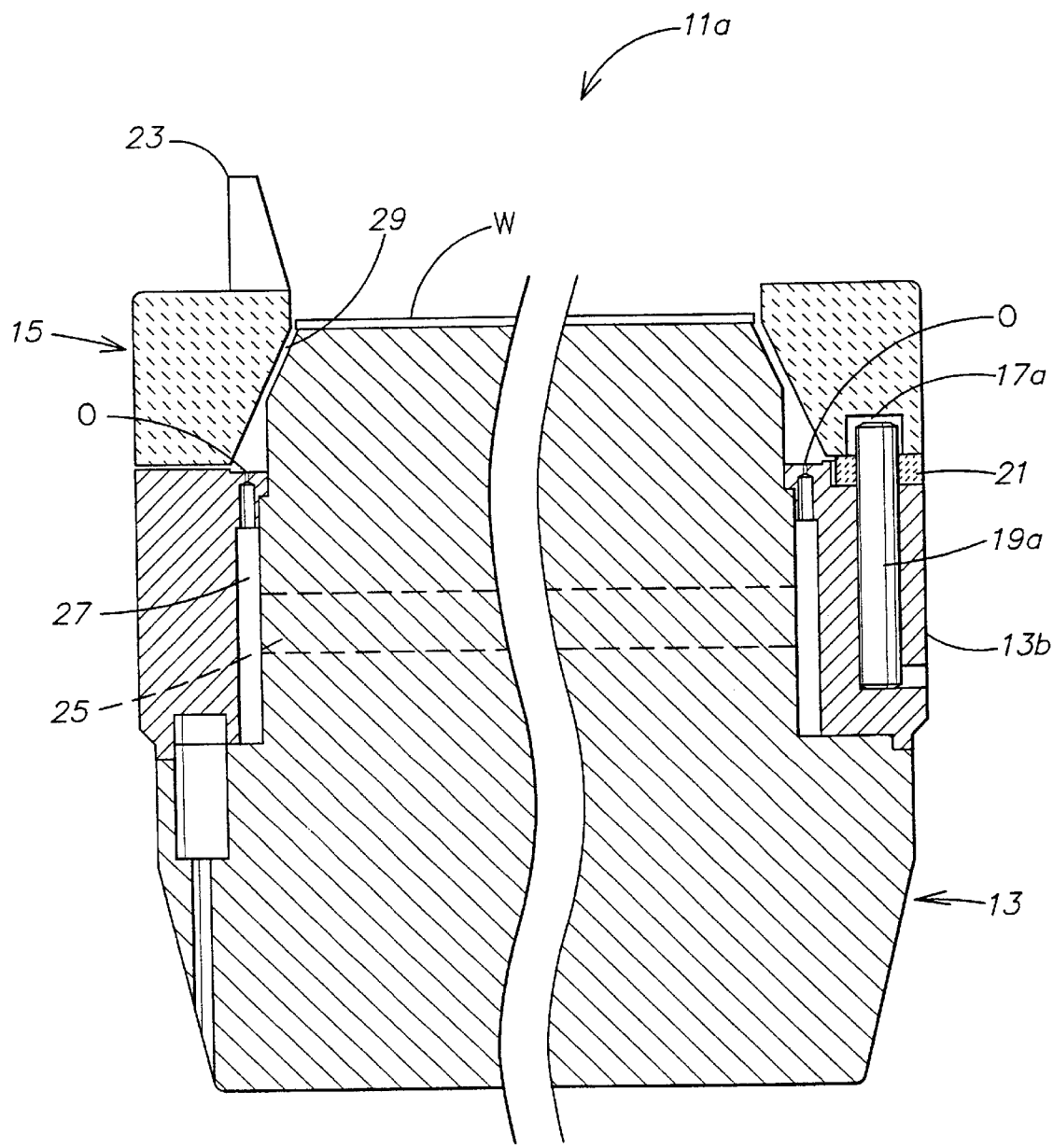
FIG. 2 is a side view, in pertinent part, of a susceptor of the invention.

FIG. 2 is a side view, in pertinent part, of a susceptor 11a, having a wafer W positioned thereon. As shown in FIG. 2 the substrate support 13, the purge ring 15 and the slots 17a–c are configured such that with use of the pad 21, no direct contact exists between the substrate support 13 and the purge ring 15. By thermally insulating the purge ring 15 from the metal substrate support 13, the purge ring 15 experiences less thermal stress then would otherwise result if the purge ring 15 were to directly contact the typically higher temperature substrate support 13. Also as shown in FIG. 2, the slot 17a has a depth greater than the length of the pin 19a to reduce thermal conduction from the substrate support 13 to the purge ring 15, via the pin 19a.

The slots 17a–c extend radially outward relative to the center of the substrate support 13 and preferably are each just slightly wider than the respective pin 19a–c. This prevents the purge ring 15 movement laterally relative to the substrate support occuring as a result of thermal cycling induced expansion and contraction from being more than the maximum distance allowing clearance between the slot 17a and the pin 19a pair. The pins 19a–c also restrict rotational movement of the purge ring 15 relative to the substrate support 13, thereby providing rotational alignment.

The substrate support 13 comprises a purge gas delivery channel 25 and a diffuser ring 13b which couples purge gas from the purge gas delivery channel 25 through a purge gas distribution channel 27 defined by an inner edge of the diffuser ring 13b and an outer edge of the substrate support 13, and then through a plurality of small orifices O formed in the diffuser ring 13b to a lower edge of the purge ring 15.

In operation the wafer W is positioned on the wafer supporting surface 13a such that the edge of the wafer W is positioned adjacent the outlet of the purge slot 29. In this manner as purge gas flows upwardly through the purge slot 29 along the edge of the wafer W, deposition on the wafer's edge is prevented. During a deposition process, the susceptor 11a is typically heated to a temperature in the range of 350° to 475° C., typically by a heating coil embedded in or contacted with the underside of, the susceptor 11a. However, for chamber maintenance or cleaning, the susceptor 11a is typically allowed to cool back to ambient temperatures.

This temperature change causes thermal expansion and contraction of the chamber elements, including the substrate support 13 and the purge ring 15. Despite thermal cycling which occurs during CVD processing, and the resulting expansion and contraction of the substrate support 13 and the diffuser ring 13b, thermally induced stresses are not imposed upon the purge ring 15, as it (and the pins 19a–c supporting it) can move radially as the temperature changes, due to the pin 19a–c and slot 17a–c coupling. Any thermally induced expansion of the gap between the purge ring 15 and the wafer W is insignificant. Accordingly edge deposition is more uniformly and reliably prevented. Moreover, the purge ring 15 may be easily lifted off the pins 19a–c for routine cleaning or replacement. Accordingly downtime is minimized.

Figure 3:
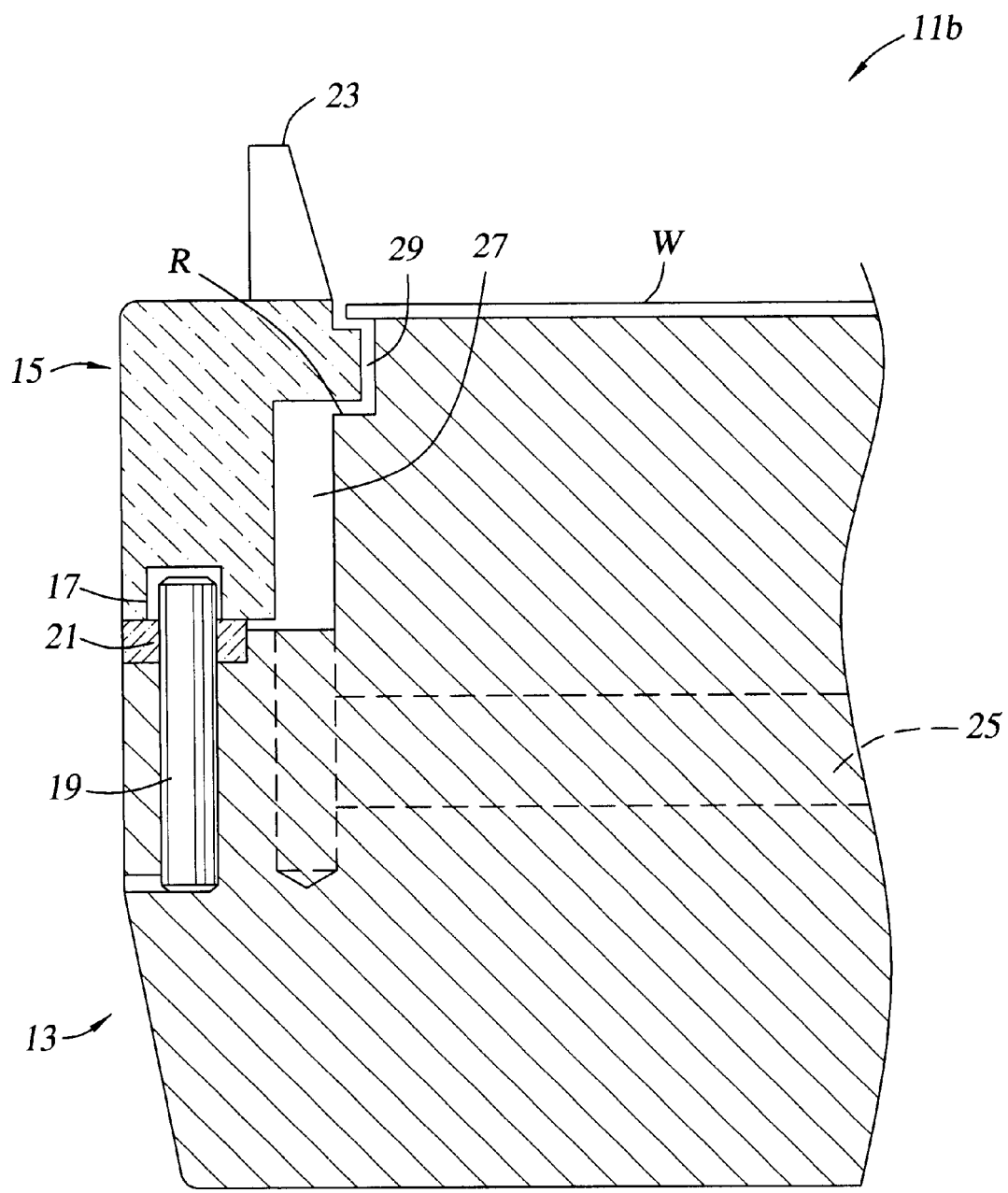
FIG. 3 is a side view, in pertinent part, of a susceptor of the invention.

FIG. 3 is a side view, in pertinent part, of a susceptor 11b. The inventive susceptor 11b of FIG. 3 is similar to the susceptor 11a of FIG. 2, except the substrate support 13 of FIG. 3 does not comprise the diffuser ring 13b. Instead, the purge gas delivery channel 25 delivers purge gas to a purge gas distribution channel 27 which is defined by an inner edge of the purge ring 15 and an outer edge of the substrate support 13, as is the more narrowly defined purge gas slot 29. The embodiment of FIG. 3 requires fewer parts, and replaces the orifices O (of FIG. 1) with a restrictor gap R.

The restrictor gap R is formed by a horizontal notch in the substrate support 13 and a corresponding horizontal protrusion in the purge ring 15. The size of the restrictor gap R is determined by the respective vertical dimensions of the substrate support 13 and the purge ring 15 to the horizontal notch or protrusion, and by the thickness of the pad 21. The embodiment of FIG. 3 reduces clogging because the restrictor gap R which expands radially around the substrate support 13 in a continuum is less likely to clog than are the plurality of orifices. By reducing the number of parts, the FIG. 3 embodiment also reduces the probability of differential expansion therebetween and the resultant particle generation. Note that, like the FIG. 1 and 2 embodiment, the purge ring 15 rests on the insulator pads 21 and is aligned by the pins 19.

Figure 4:
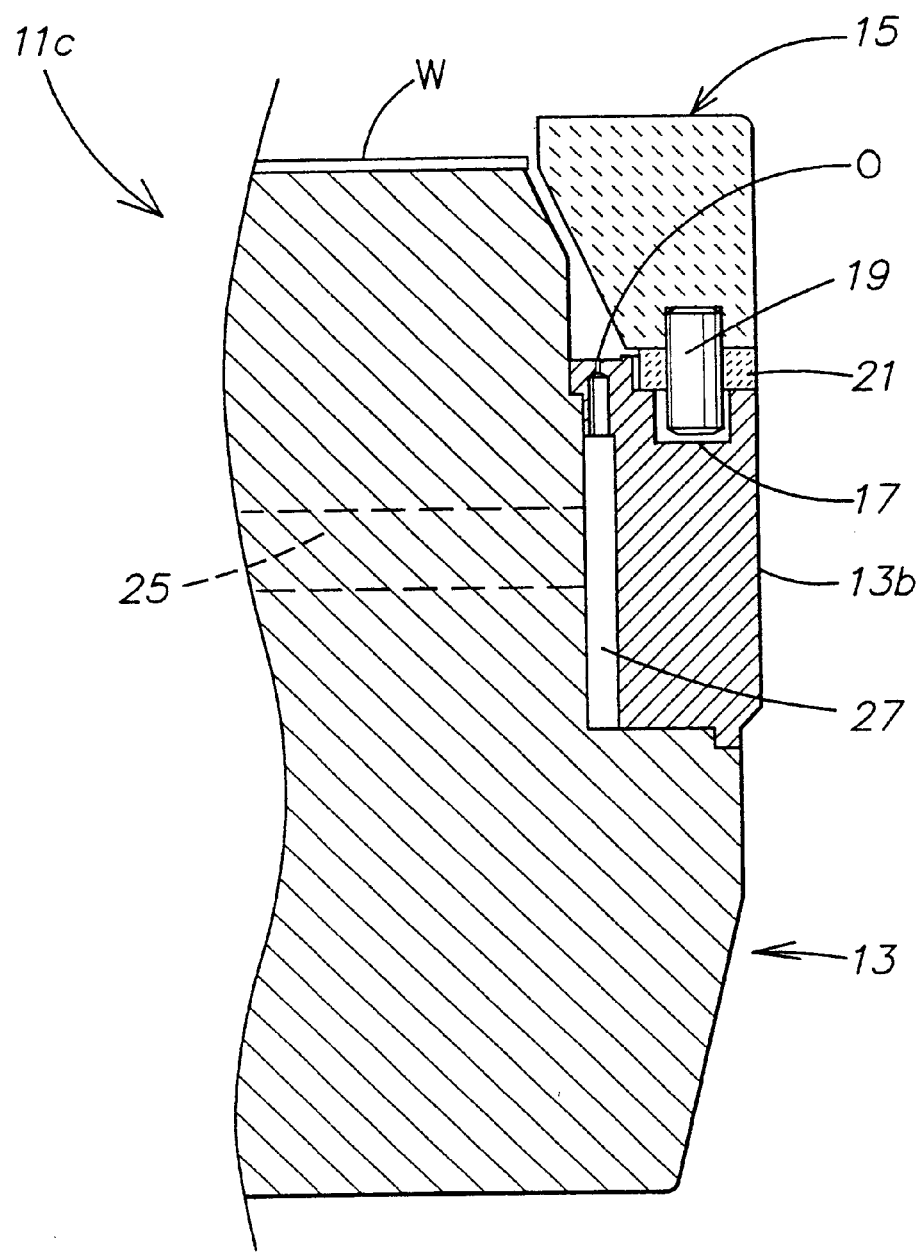
FIG. 4 is a side view in pertinent part of a susceptor of the invention.

FIG. 4 is a side view, in pertinent part, of a susceptor 11c. As shown in FIG. 4, the purge ring 15 of the inventive susceptor 11c has a plurality of pins 19 (only one shown) which extend downward from the bottom surface of the purge ring 15. The pins 19 are pressed into the purge ring 15 and the pads 21 are secured to the pins 19 in the same manner, or maybe integral to the pins 19. In operation, each pin 19 is inserted within a corresponding slot 17 located on the substrate support 13. In this example the slots 17 are formed in the diffuser ring portion 13b of the substrate support 13. Thus, FIG. 4 shows that the positions of the pins 19 and the slots 17 may be switched, and still achieve the advantages of pin and slot coupling.

Figure 5A:
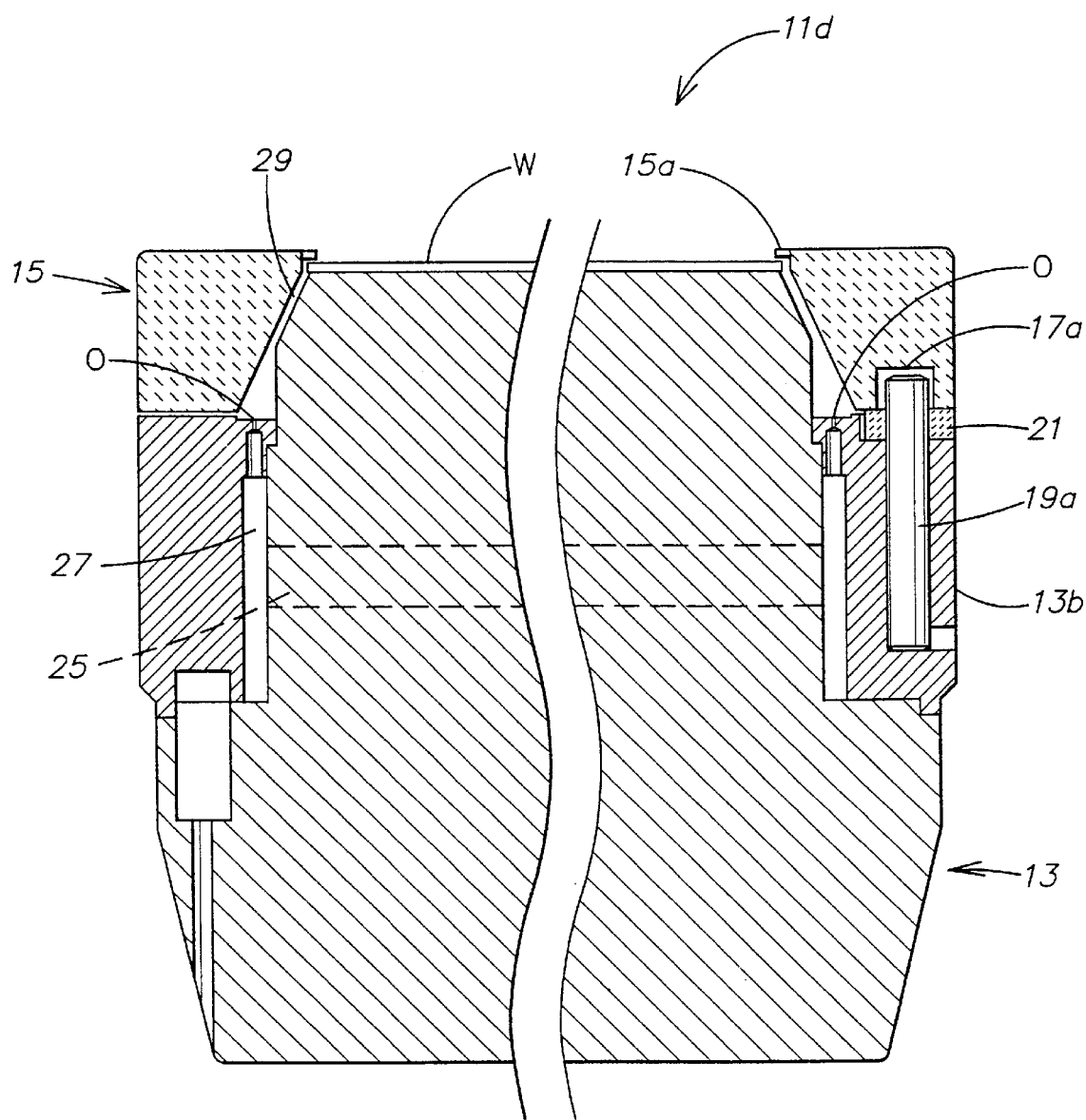
FIGS. 5A and 5B are side views in pertinent part of a susceptor of the invention.
Figure 5B:
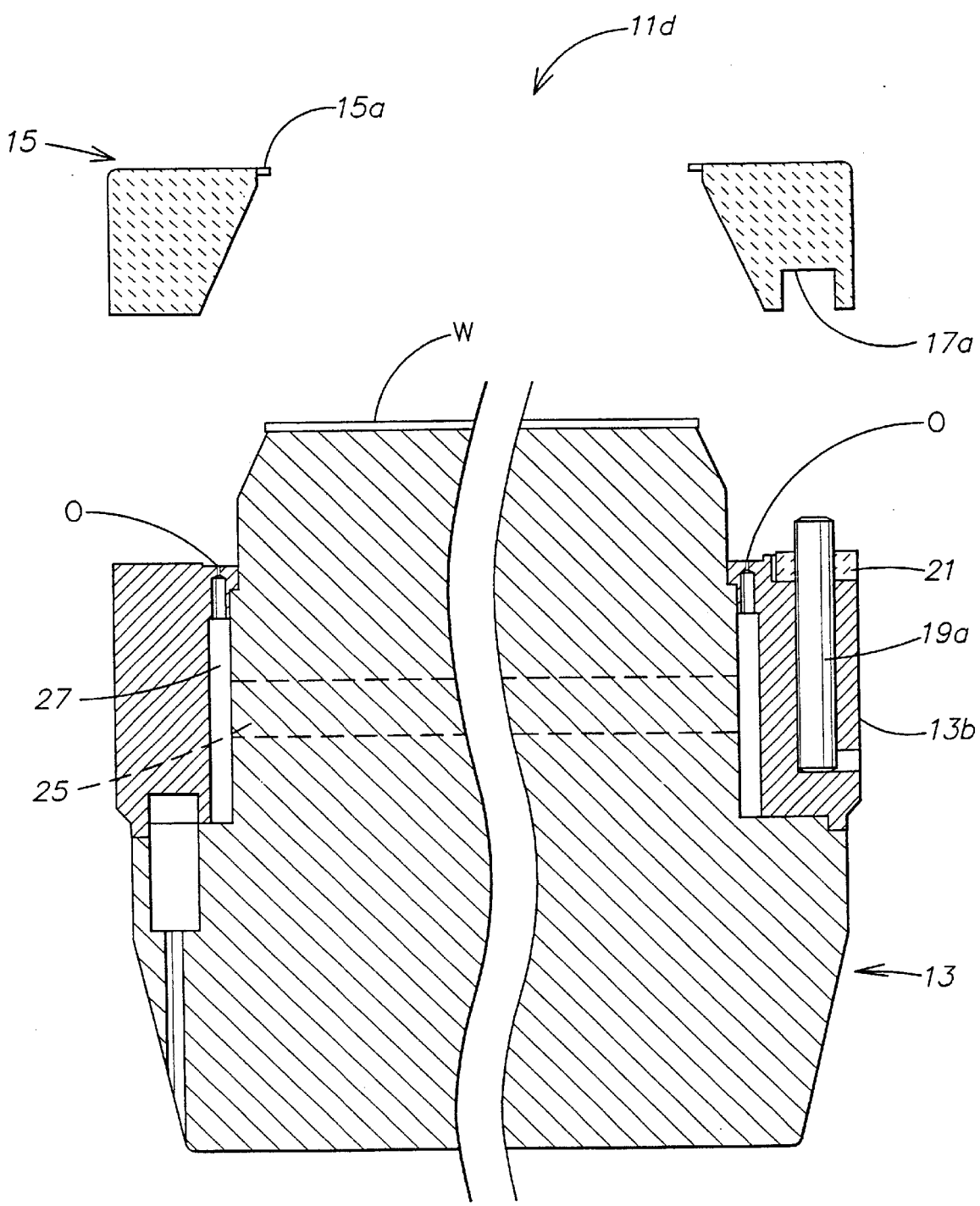

FIGS. 5A and 5B are side views, in pertinent part, of a susceptor 11d. The inner edge 15a of the purge ring 15 of FIGS. 5A and 5B is configured such that the inner edge 15a overhangs the edge of the wafer W. Thus, the inner edge 15a of the purge ring 15 functions as both a purge ring and a shadow ring overhanging or shadowing the wafer's edge. The pin and slot coupling of FIGS. 5A and 5B allows the substrate support 13 to expand and contract without effecting the shape or position of the inner edge 15a of the purge ring 15, as described above with reference to FIGS. 2 and 3, and is referred to in this application as self-aligning and non contact. FIG. 5A shows the purge ring 15 and the inner edge 15a of the purge ring 15 in a process position, and FIG. 5B shows the purge ring 15 and the inner edge 15a of the purge ring 15 in a wafer W transfer position. Because purge ring 15 overlaps the wafer's edge, the purge ring is conventionally supported in a wafer W transfer position above the substrate support 13 (e.g., by a hanger or lip which protrudes form the chamber wall) while a wafer W is placed on or extracted from the substrate support 13. After a wafer W is placed on the substrate 13, the substrate support 13 elevates and engages the bottom of the purge ring 15, transferring the purge ring 15 from the lip to the substrate support 13 as further described below.

Conventional substrate supports 13, whether to be used with a purge ring 15 and/or shadow ring 4, are initially lowered to a wafer W transfer position. A wafer handler then carries a wafer W into position above the substrate support 13 and the lift pins (not shown) lift the wafer W off the wafer handler. Thereafter, the wafer handler retracts, and the substrate support 13 is further elevated to engage the shadow ring 4.

Figure 6:
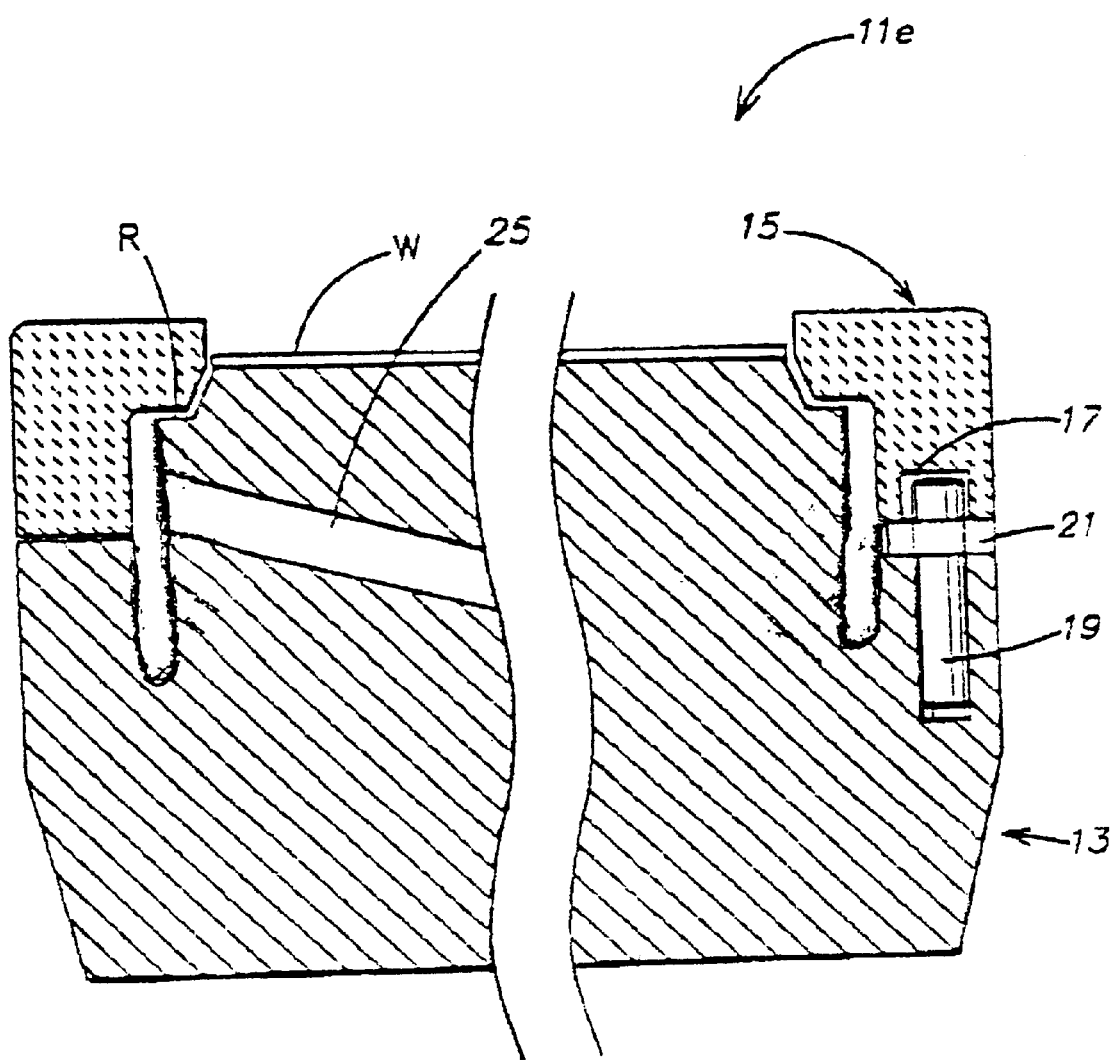
FIG. 6 is a side view in pertinent part of a susceptor of the invention.

FIG. 6 is a side view in pertinent part of a susceptor 11e. The inventive susceptor 11e is configured to facilitate access to the purge gas distribution channel 25 for cleaning. Specifically, the surface of the substrate support 13 in which the pin 19 (or in an alternative embodiment, the slot 17) is located, is below the outlet of the purge gas distribution channel 25. Thus, when the purge ring 15 and/or shadow ring 4 is removed from the substrate support 13, the gas distribution channel's outlet is exposed. To further facilitate cleaning, the purge gas distribution channel 25 may be angled upwardly (preferably between 0° and 30°), as shown in FIG. 6.

Figure 7:
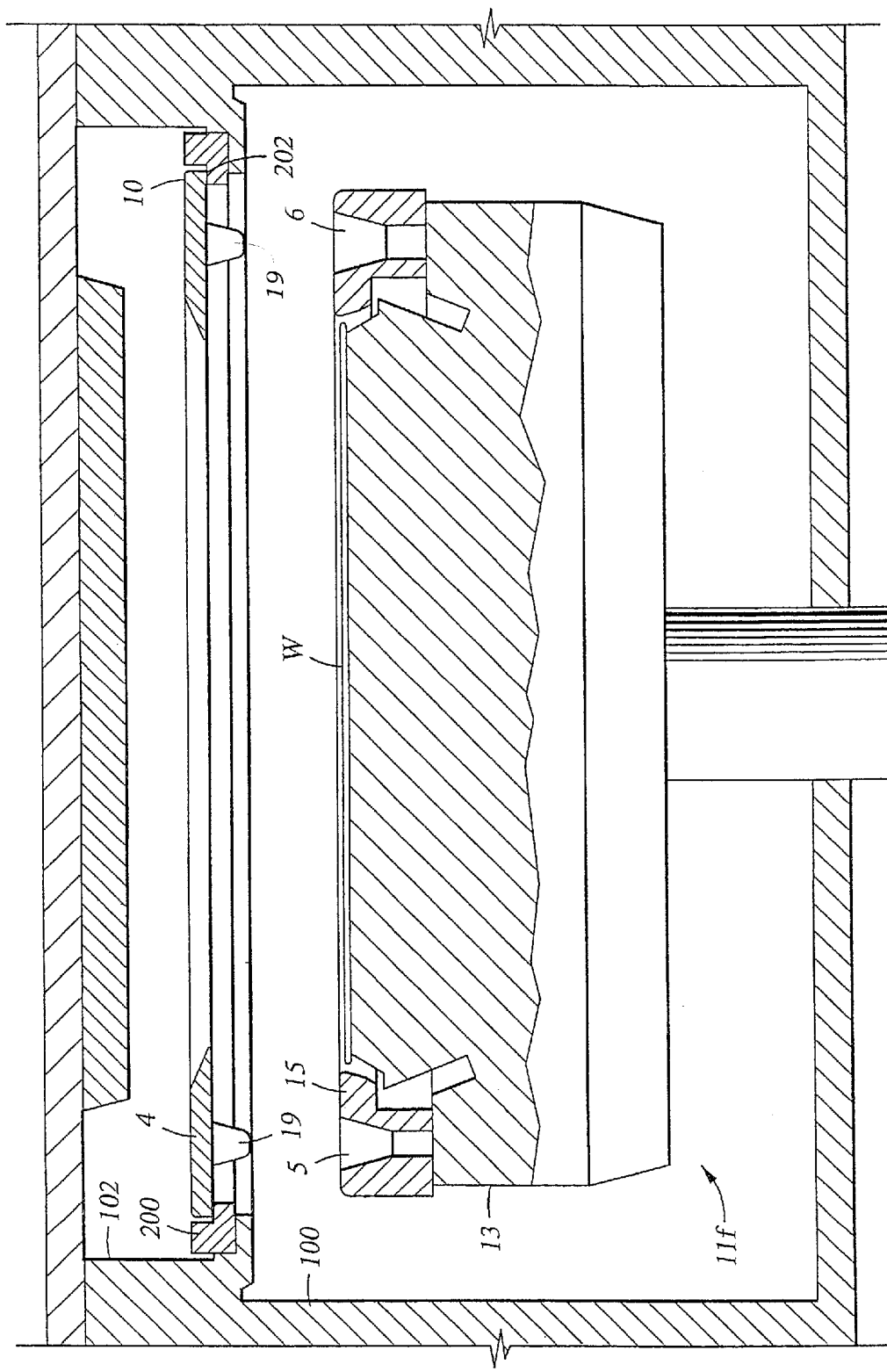
FIG. 7 is a side view of a chamber showing a susceptor of the invention in a non-processing position.

FIG. 7 is a side view of a chamber showing a susceptor 11f of the invention in a lowered non-processing position. The susceptor 11f comprises a removable first edge ring, such as a shadow ring 4, supported by a chamber body ring 200 disposed on the internal surface 102 of the processing chamber body 100 above the substrate support 13 and a second ring, such as a purge ring 15, disposed on the substrate support 13. The purge ring 15 may be attached to the substrate support 13 as described above relating to FIGS. 1–6. The substrate support may be made of various materials, such as aluminum and ceramic, and may include a heating element, such as a resistive heating coil. The shadow ring 4 comprises a plurality of tapered or frustoconically shaped pins 19 (two shown), equally spaced around the perimeter of the shadow ring 4 and extending downwardly therefrom. The purge ring 15 includes at least one tapered or frustoconically shaped alignment recess 5 and at least one tapered or frustoconically shaped alignment slot 6 formed therein. Although the invention is shown and described with a shadow ring having pins thereon and a purge ring having recess/slot thereon, it is understood that invention contemplates embodiments wherein the pin and recess/slot coupling may be disposed on either the shadow ring or the purge ring. The invention also contemplates embodiments wherein either the pins or the recesses/slots include tapered surfaces.

Figure 8:
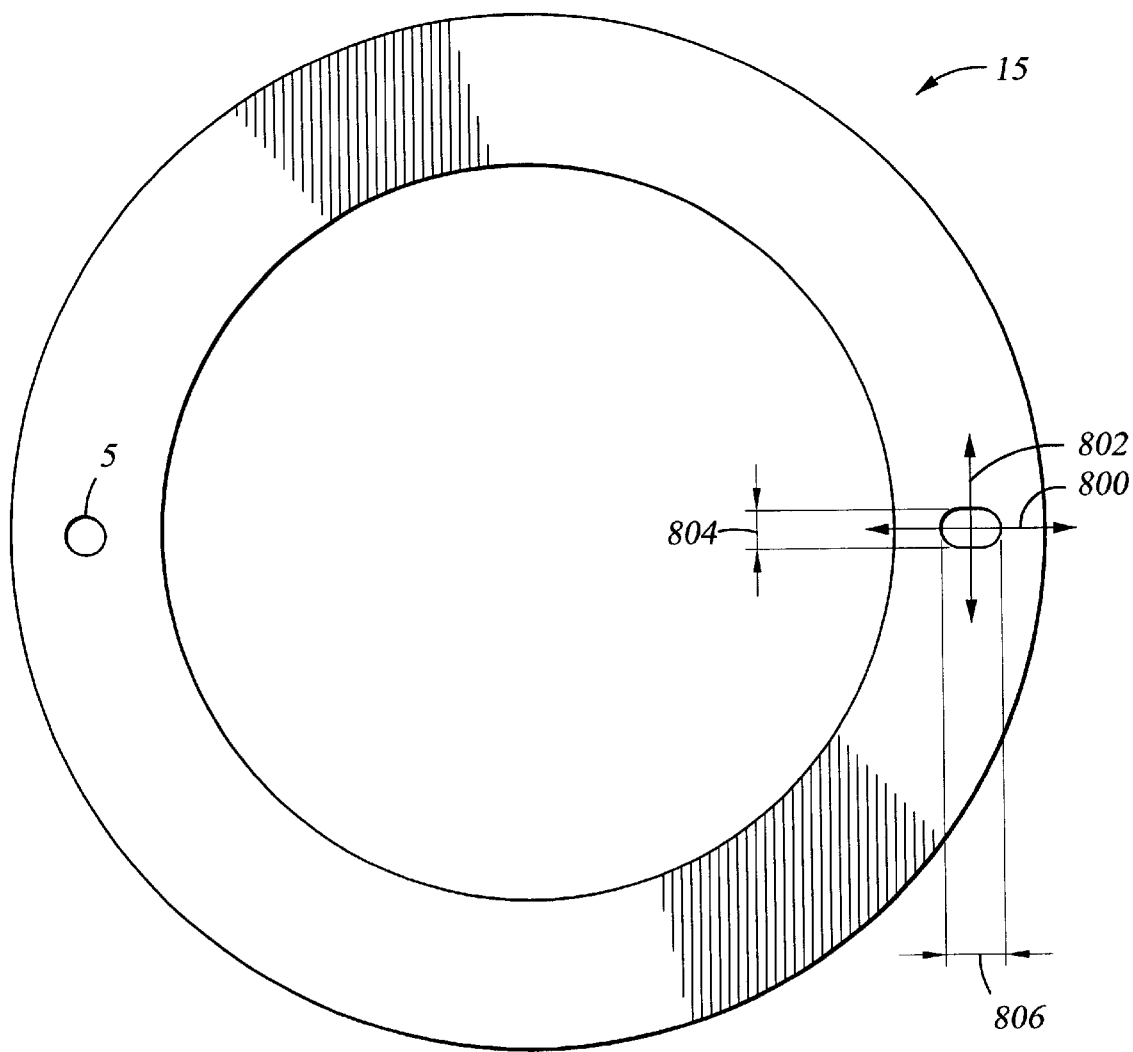
FIG. 8 is a top view of a purge ring of the invention.

The pins 19 are positioned to interface with the alignment recess 5 and the alignment slot 6. The alignment recess 5 and the alignment slot 6 are at least as wide as a corresponding one of the plurality of pins 19. In one aspect, the width is defined as the dimension perpendicular to the radial direction, relative to the center of the purge ring 15. Referring to FIG. 8, which is a top view of a purge ring 15 of the invention showing the alignment recess 5 and the alignment slot 6, line 800 represents the radial direction relative to the center of the purge ring 15, and line 802 represents the direction perpendicular to the radial direction relative to the center of the purge ring 15. The width of the alignment slot 6, being the dimension perpendicular to the radial direction relative to the center of the purge ring 15, is shown by segment 804. The radial dimension of the alignment slot 6 is shown by segment 806. The alignment slot 6 extends in a radial direction, relative to the center of the purge ring 15, a length that is sufficient to compensate for any difference in thermal expansion between the purge ring 15 and the shadow ring 4. The radial dimension (i.e., length) of the alignment slot 6 is up to about sixty mils greater, preferably up to about forty mils greater, than the radial dimension of the corresponding pin 19. The width of the alignment recess 5 and alignment slot 6 is between about three mils and about ten mils wider, preferably between about three mils and about eight mils wider, than the width of the corresponding pin 19. The coupling of the pins 19 with the alignment recess 5 and the alignment slot 6 restricts movement of the shadow ring 4 caused by thermal cycling induced expansion and contraction or other causes to less than the length of the alignment slot 6. The pins 19 also restrict rotational movement of the shadow ring 4 relative to the purge ring 15, thereby providing rotational alignment.

The pins 19 as shown in FIG. 7 preferably have a frustoconical shape, tapering from a base portion to a top portion. The alignment recess 5 and the alignment slot 6 have matching tapering sidewalls forming a wider opening portion and a narrower bottom portion for receiving the tapered pins 19. This configuration allows for and corrects gross misalignment between the two rings because the narrower tip portion of the pins 19 can be inserted into the wider opening portion of the recess 5 and slot 6 with a greater margin of misalignment. Thus, with frustoconically shaped or tapered pins 19 instead of non-tapering (i.e., cylindrical) pins, recess 5, and slot 6, misalignment of the shadow ring 4 with the purge ring 15, due to thermal expansion or other causes can be corrected when the pins 19 are inserted into the recess 5 and slot 6 when the rings come together. As the pins 19 are inserted into the recess 5 and slot 6, misalignment between the shadow ring and the purge ring is corrected as the surface of the pin 19 slides along the surface defined by the recess 5 or slot 6. The two rings are aligned as the pins 19 are fully inserted into the recess 5 and slot 6.

The pin 19 and recess 5/slot 6 coupling allows the shadow ring 4 to move with respect to the purge ring 15 due to different thermal expansions between the two rings without imposing stresses on either ring that could cause ring deformation, flaking or breakage of any of the components. The shadow ring 4 remains in pivotal alignment to the purge ring 15 at the location of the pin 19 and recess 5 coupling, while the pin 19 and slot 6 coupling allows the shadow ring to move slightly (i.e., restricted by the length of the slot 6) relative to each other due to different thermal expansions between the two rings. The invention provides consistent alignment of the shadow ring 4 with the purge ring 15 and the substrate. Moreover, the shadow ring 4 may be easily removed for cleaning or replacement. Down time is thereby minimized.

Figure 9:
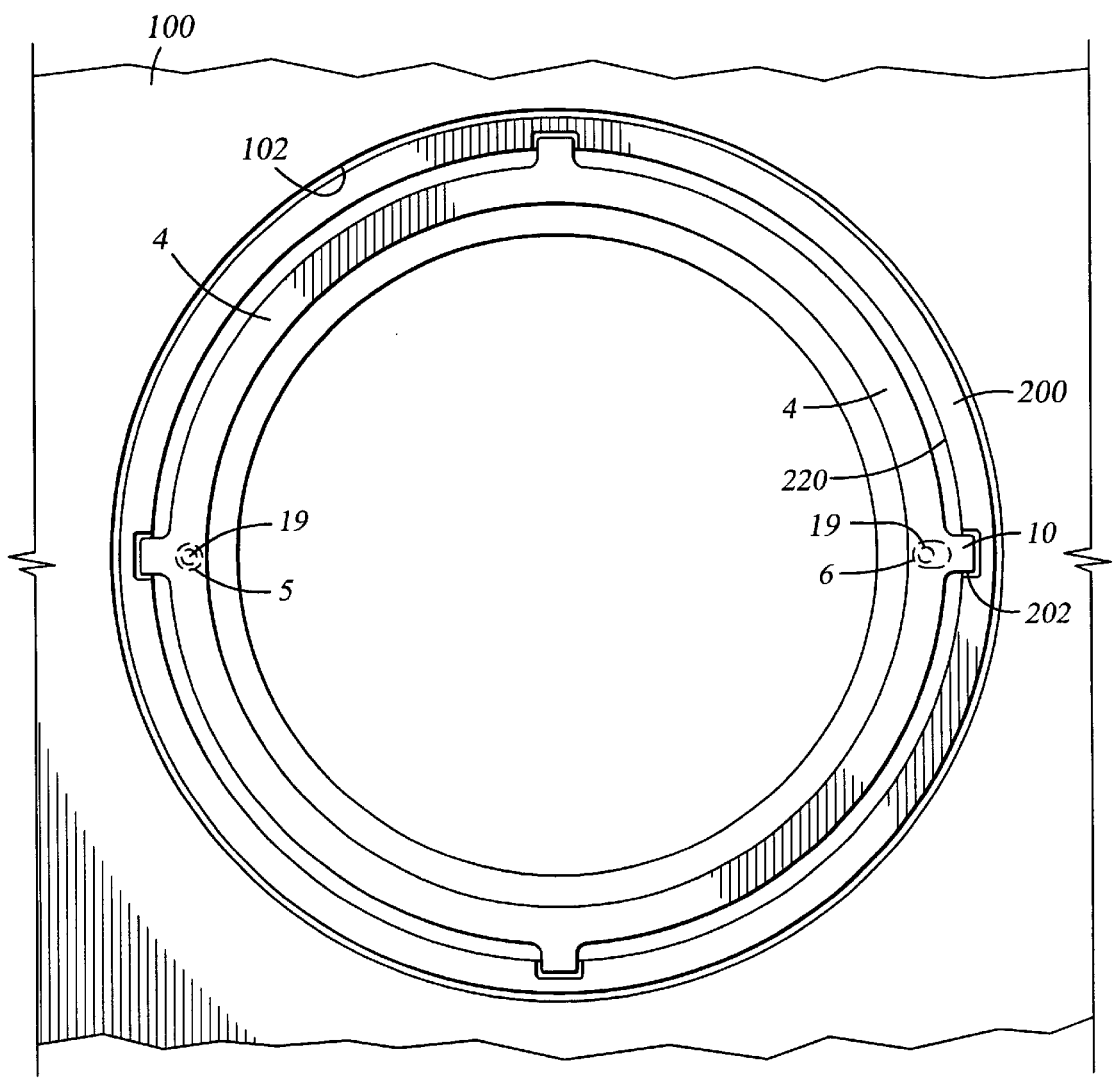
FIG. 9 is a top view of a shadow ring supported on a chamber body ring of the invention.

FIG. 9 is a top view of a shadow ring 4 supported on a chamber body ring 200. A chamber body ring 200 is secured to the internal surface 102 of the chamber body 100. The chamber body ring 200 includes a plurality of recesses 202 formed in the upper portion of the internal surface 220 of the chamber body ring 200. The shadow ring 4 includes a plurality of projections 10 configured to rest on the surface of the chamber body ring 200 defined by the recesses 202. Preferably, four projections 10 are spaced equally along the perimeter of the shadow ring 4. When not coupled to the purge ring 15, the shadow ring 4 may be supported by the chamber body ring 200 via the projections 10 resting on the surface of the recesses 202. The recesses 202 are sized to allow for thermal expansion of the shadow ring 4, and yet keep the shadow ring 4 sufficiently aligned with the purge ring 15 so that the pins 19 stay within the capture range of the recess 5 and slot 6. The sidewall surfaces of the recess 202 may also be tapered to urge a shadow ring 4 into the desired aligned position on the chamber body ring 200.

Figure 10:
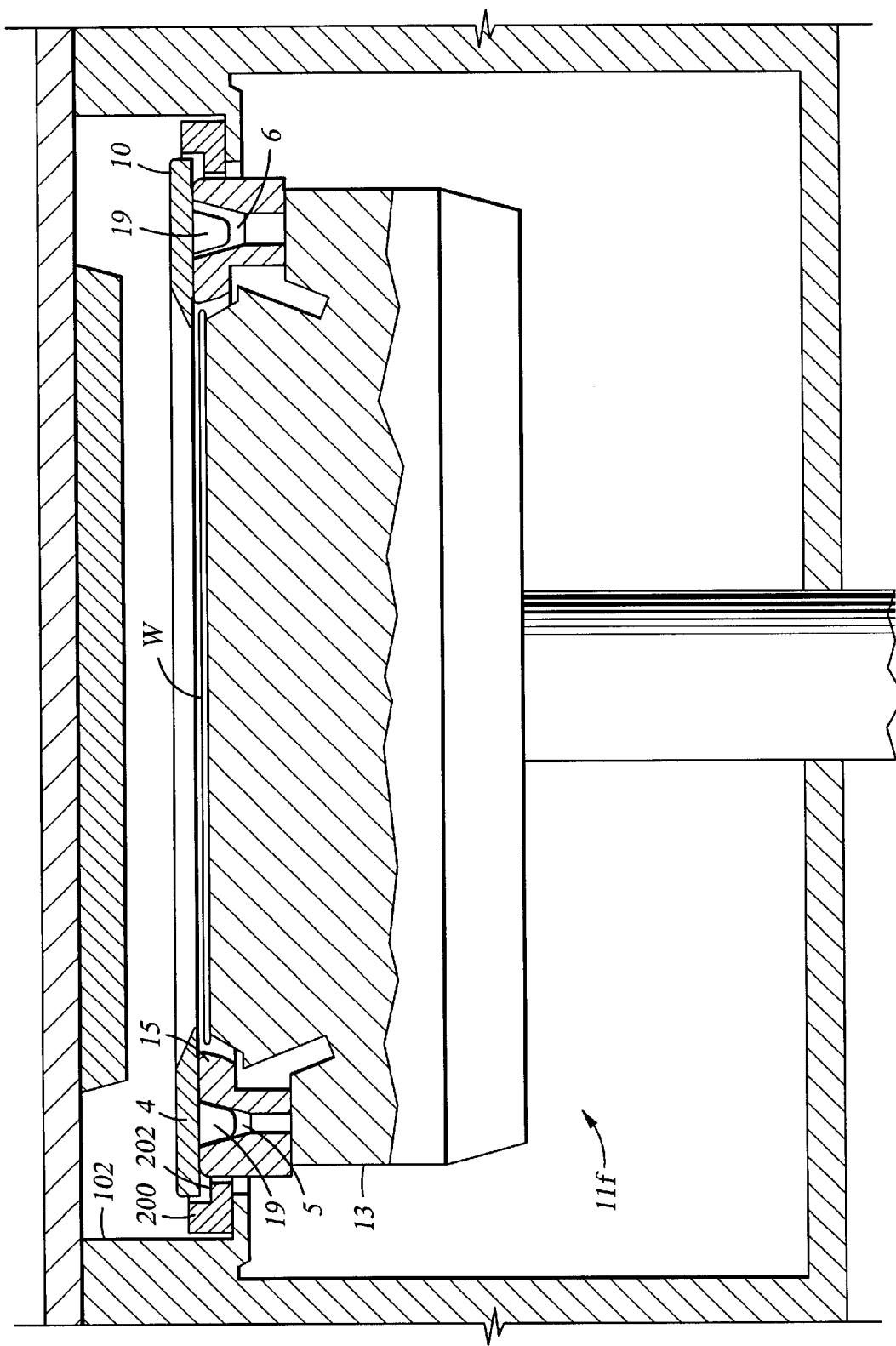
FIG. 10 is a side view of a chamber showing a susceptor of the invention in a processing position.

FIG. 10 is a side view of a chamber showing a susceptor 11f in a processing position. As shown, the purge ring 15 attached to the substrate support 13 contacts and lifts the shadow ring 4. The pins 19 of the shadow ring 4 are inserted into the recess 5 and slot 6 of the purge ring 15. The shadow ring 4 is thereby lifted off the chamber body ring 200, so that the projections 10 of the shadow ring 4 are lifted off the internal surface 220 of the chamber body ring 200 defined by the recesses 202. In this configuration, the shadow ring 4 is positioned about 3 to 5 millimeters above a wafer W and overhangs a portion of the perimeter, or edge, of the wafer W, preventing deposition thereon during CVD processing.

In operation, the substrate support 13 is initially lowered to a wafer transfer position, as shown in FIG. 7. A wafer handler comprising a robot blade then carries a wafer into position above the substrate support 13. Lift pins (not shown) lift the wafer W off the robot blade, and the robot blade retracts. The substrate support 13 is elevated to position the substrate thereon, and then the substrate support 13 further elevates so that the purge ring 15 attached thereto lifts the shadow ring 4 off the chamber body ring 200, as shown in FIG. 10. As the purge ring 15 engages the shadow ring 4, the pins 19 are inserted into the alignment recess 5 and alignment slot 6. The tapered surfaces of the pins 19 slides along the tapered surfaces of the alignment recess 5 and alignment slot 6, urging the shadow ring 4 into desired alignment with the purge ring 15.

Figure 11:
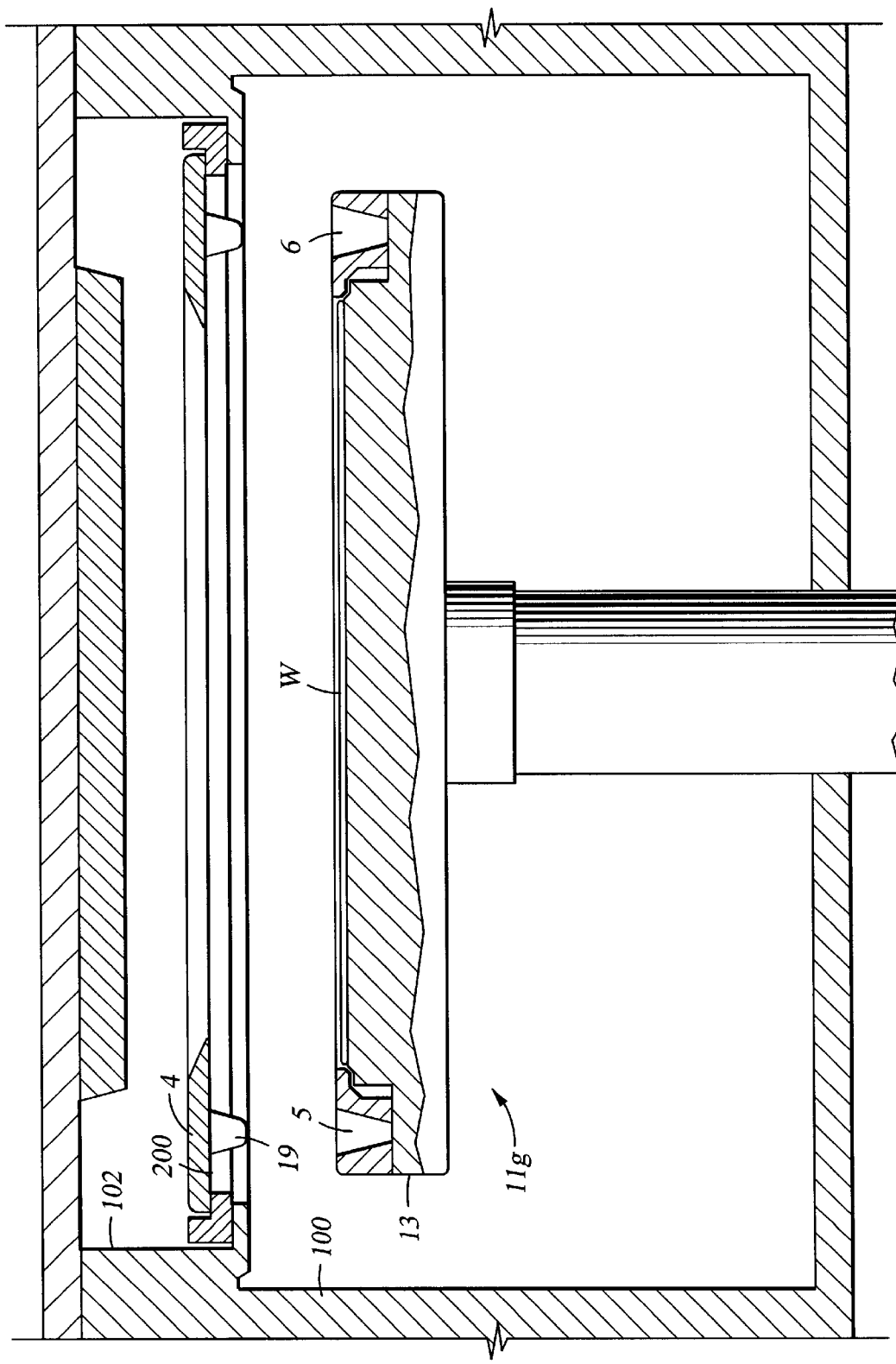
FIG. 11 is a side view of a chamber showing a susceptor of the invention.

FIG. 11 is a side view of a chamber showing a susceptor 11g in a non-processing configuration. In this aspect of the invention, the substrate support 13 includes a ceramic susceptor and a ceramic purge ring 15 disposed thereon. The purge ring 15 and the shadow ring 4 include the pin and slot/recess coupling of the invention as described above.

As is apparent from the above description, a chamber such as the chamber described in commonly assigned U.S. patent application Ser. No. 09/103,462, filed Jun. 24, 1998 (incorporated in its entirety), when employing the inventive susceptor of FIGS. 1 through 5, provides superior edge deposition prevention and increased throughput as compared to conventional deposition chambers (CVD, PVD, etc.).

The foregoing description discloses only the preferred embodiments of the invention, modifications of the above disclosed apparatus and method which fall within the scope of the invention will be readily apparent to those of ordinary skill in the art. For instance, the inventive susceptor comprises pin and slot coupling between any type of edge ring (purge ring and/or shadow ring), whether the pins are located on the substrate support or the ring. Although each of the figures shows the use of thermally insulating pads these pads are optional. Further, it will be understood that a heating element may be included in the susceptor, as is conventionally known. Also as conventionally known, each of the purge gas delivery channels 25 of the various embodiments of the invention preferably open into a purge gas distribution channel 27 which also extends somewhat below the opening of the purge gas delivery channel 25 (as shown in each of the figures), so as to create a buffer channel which ensures more even distribution of the purge gas to the purge slots 29.

The terms pin and slot are to be broadly interpreted to include shapes other than straight pins and slots 6 (e.g., rectangular keys, etc.). Further, purge ring or purge ring/shadow ring can be advantageously removably coupled to a substrate support, by mechanisms other than pin and slot coupling. Any removably coupled purge ring will benefit from the exposed outlet of the purge gas delivery channel and the upwardly angled purge gas delivery channel. Similarly a susceptor whether or not having a removably coupled purge ring, can benefit from the definition of a purge gas distribution channel having a restrictor gap between the substrate support and the purge ring. Thus, these aspects of the invention should not be respectively limited to pin and slot coupling or to removably coupled purge rings.

While the present invention has been disclosed in connection with the preferred embodiments thereof, it should be understood that other embodiments may fall within the spirit and scope of the invention, as defined by the following claims.

What is claimed is:

1. An apparatus for processing substrates, comprising:
   a chamber;
   a substrate support disposed in the chamber;
   a first edge ring disposed on the substrate support, wherein the first edge ring comprises one or more tapered recesses and one or more slots; and
   a second edge ring having two or more matching tapered pins disposed thereon for mating engagement with the recesses and slots of the first edge ring.

2. The apparatus of claim 1, further comprising:
   a chamber body ring disposed on an interior surface of the chamber, the chamber body ring having one or more recesses for supporting engagement with the second edge ring.

3. The apparatus of claim 2 wherein the first edge ring comprises a urge ring.

4. The apparatus of claim 2 wherein the second edge ring comprises a shadow ring.

5. The apparatus of claim 2 wherein the first edge ring includes one tapered recess and one diametrically positioned tapered slot, and wherein the second edge ring includes two tapered pins diametrically positioned for mating engagement with the recess and the slot.

6. The apparatus of claim 2 wherein the substrate support comprises a purge gas channel, and the first edge ring comprises a purge ring.

7. The apparatus of claim 2 wherein the one or more recesses on the chamber body ring include tapered side surfaces.

8. The apparatus of claim 1, wherein the first edge ring is made of a material having a lower coefficient of thermal expansion (CTE) than that of the substrate support.

9. The apparatus of claim 1, wherein the one or more slots of the first edge ring extend in a radial direction, relative to the center of the first edge ring, to a length that is sufficient to compensate for any difference in thermal expansion between the first edge ring and the second edge ring.

10. The apparatus of claim 1, wherein the radial dimension of the one or more slots of the first edge ring is up to about 60 mils greater than the radial dimension of the one or more matching tapered pins of the second edge ring.

11. The apparatus of claim 1, wherein the width of the one or more tapered recesses and one or more slots of the first edge ring is between about 3 mils and about 10 mils wider than the width of the one or more matching tapered pins of the second edge ring.

12. The apparatus of claim 1, wherein each of the one or more tapered pins of the second edge ring is surrounded by an insulating pad made of a thermally insulating material.

13. The apparatus of claim 1, wherein the substrate support further comprises one or more matching tapered pins disposed thereon for mating engagement with the recesses and slots of the first edge ring.

14. The apparatus of claim 13, wherein each of the one or more tapered pins of the substrate support is surrounded by an insulating pad made of a thermally insulating material.

15. An apparatus comprising:
    a chamber;
    a substrate support;
    a first edge ring disposed on the substrate support, comprising two or more tapered pins;
    a second edge ring, comprising one or more tapered recesses and one or more slots, in mating engagement with the two or more tapered pins of the first edge ring; and
    a chamber body ring disposed on an interior surface of the chamber, wherein the chamber body ring comprises one or more recesses for supporting engagement with the second edge ring.

16. The apparatus of claim 15, wherein the first edge ring is made of a material having a lower coefficient of thermal expansion (CTE) than that of the substrate support.

17. The apparatus of claim 15, wherein the one or more slots of the second edge ring extend in a radial direction, relative to the center of the second edge ring, to a length that is sufficient to compensate for any difference in thermal expansion between the first edge ring and the second edge ring.

18. The apparatus of claim 15, wherein the radial dimension of the one or more slots of the first edge ring is up to about 60 mils greater than the radial dimension of the one or more matching tapered pins of the second edge ring.

19. The apparatus of claim 15, wherein the width of the one or more tapered recesses and one or more slots of the second edge ring is between about 3 mils and about 10 mils wider than the width of the one or more matching tapered pins of the first edge ring.

20. The apparatus of claim 15, wherein each of the one or more tapered pins of the first edge ring is surrounded by an insulating pad made of a thermally insulating material.

21. The apparatus of claim 15, wherein each of the one or more tapered pins of the chamber body ring is surrounded by an insulating pad made of a thermally insulating material.

22. The apparatus of claim 15, wherein the substrate support comprises a purge gas channel, and the first edge ring comprises a purge ring.

23. An apparatus for processing substrates, comprising:
    a chamber;
    a substrate support disposed at least partially in the chamber;
    a first edge ring disposed on the substrate support, comprising one or more tapered recesses and one or more slots;
    a second edge ring disposed in mating engagement with the first edge ring, comprising two or more tapered pins; and
    a chamber body ring disposed on an interior surface of the chamber, wherein the chamber body ring comprises one or more tapered recesses for supporting engagement with the second edge ring.

24. The apparatus of claim 23, wherein the substrate support comprises a purge gas channel, and the first edge ring comprises a purge ring.

25. An apparatus for processing substrates, comprising:
    a chamber;
    a substrate support, disposed at least partially in the chamber, comprising a purge gas channel;
    a purge ring, disposed on the substrate support, comprising one or more tapered recesses and one or more diametrically positioned slots;

a shadow ring, comprising two or more tapered pins diametrically positioned for mating engagement with the recesses and slots of the purge ring;

a chamber body ring disposed on an interior surface of the chamber, wherein the chamber body ring comprises one or more tapered recesses for supporting engagement with the shadow ring.

26. An apparatus for processing substrates, comprising:

a chamber;

a substrate support, disposed at least partially in the chamber, comprising a purge gas channel;

a purge ring disposed on the substrate support, comprising two or more tapered pins;

a shadow ring, comprising one or more tapered recesses and one or more slots, disposed in mating engagement with the two or more tapered pins of the purge ring; and a chamber body ring disposed on an interior surface of the chamber, wherein the chamber body ring comprises one or more tapered recesses for supporting engagement with the shadow ring.

* * * * *